(12) United States Patent  
Huang et al.

(10) Patent No.: US 7,474,539 B2
(45) Date of Patent: Jan. 6, 2009

(54) INDUCTOR

(75) Inventors: Chung-Chi Huang, DuPont, WA (US); Richard Kunze, Woodinville, WA (US); Beom-Taek Lee, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 453 days.

(21) Appl. No.: 11/105,141

(22) Filed: Apr. 11, 2005

(65) Prior Publication Data

US 2006/0227522 A1    Oct. 12, 2006

(51) Int. Cl.
*H05K 7/00* (2006.01)

(52) U.S. Cl. .................. 361/782; 361/780; 361/793; 336/200; 336/229; 174/250; 174/255

(58) Field of Classification Search .............. 361/782, 361/780, 793; 336/200, 229
See application file for complete search history.

(56) References Cited

U.S. PATENT DOCUMENTS

| | | | |
|---|---|---|---|
| 5,521,573 A * | 5/1996 | Inoh et al. ............... 336/180 |
| 5,990,776 A | 11/1999 | Jitaru | |
| 6,175,727 B1 * | 1/2001 | Mostov .................. 455/307 |
| 6,198,374 B1 * | 3/2001 | Abel ..................... 336/200 |
| 6,370,033 B1 * | 4/2002 | Saegusa et al. ........... 361/777 |
| 6,388,551 B2 * | 5/2002 | Morikawa ................ 336/223 |
| 6,711,814 B2 * | 3/2004 | Barr et al. ................ 29/852 |
| 2002/0022110 A1 | 2/2002 | Barr et al. | |
| 2003/0030533 A1 * | 2/2003 | Waffenschmidt ......... 336/200 |
| 2005/0122699 A1 * | 6/2005 | Maeda et al. ............ 361/793 |

FOREIGN PATENT DOCUMENTS

EP    1 235 295 A2    8/2002

* cited by examiner

*Primary Examiner*—Jeremy C Norris
*Assistant Examiner*—Hoa C Nguyen
(74) *Attorney, Agent, or Firm*—Schwabe, Williamson & Wyattt, P.C.

(57) ABSTRACT

A component having an inductor to at least partially compensate for a capacitance in a circuit of the component, is described herein.

12 Claims, 7 Drawing Sheets

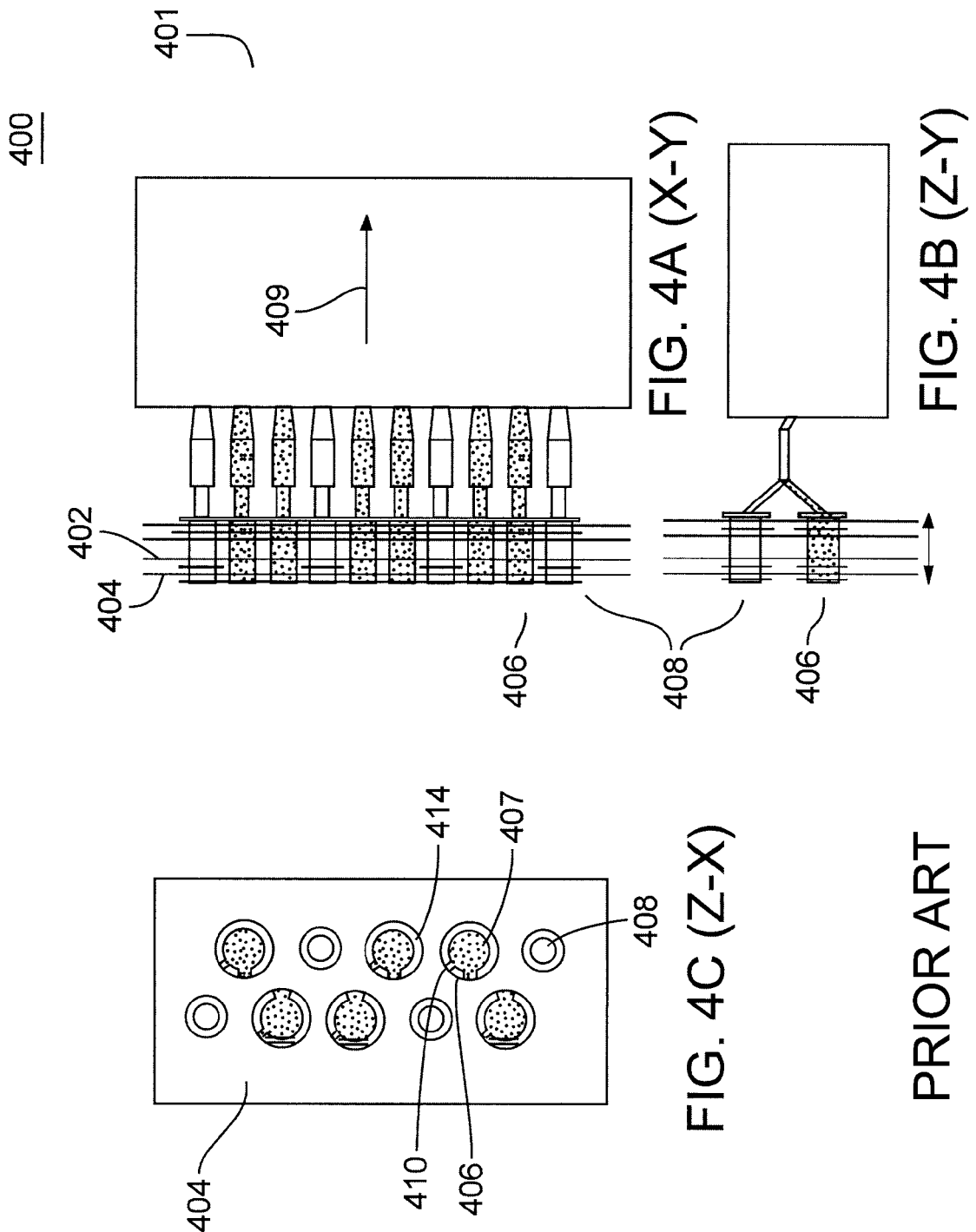

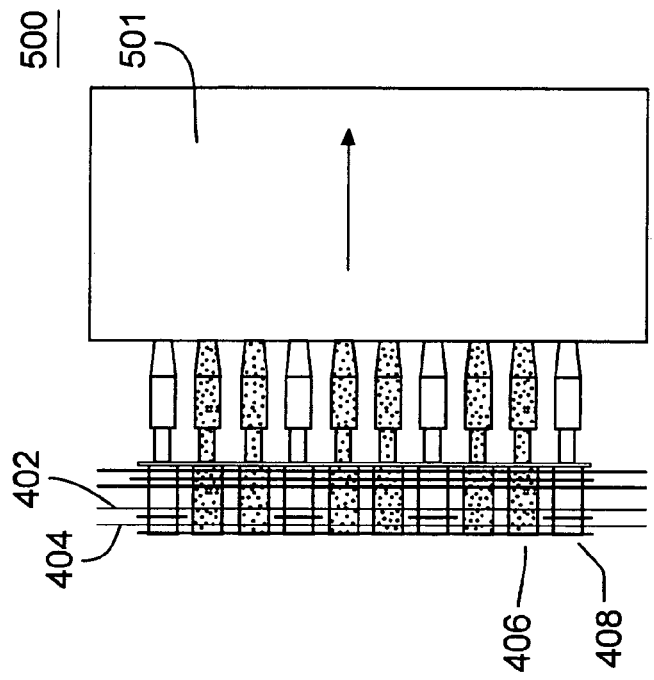
FIG. 5A (X-Y)
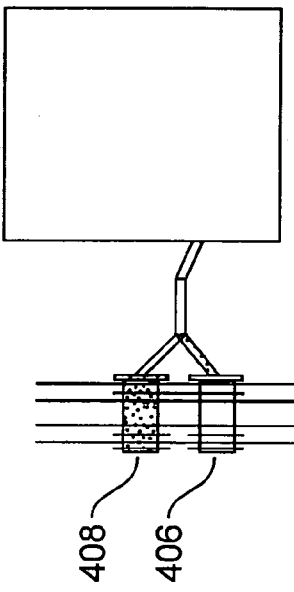
FIG. 5B (Z-Y)
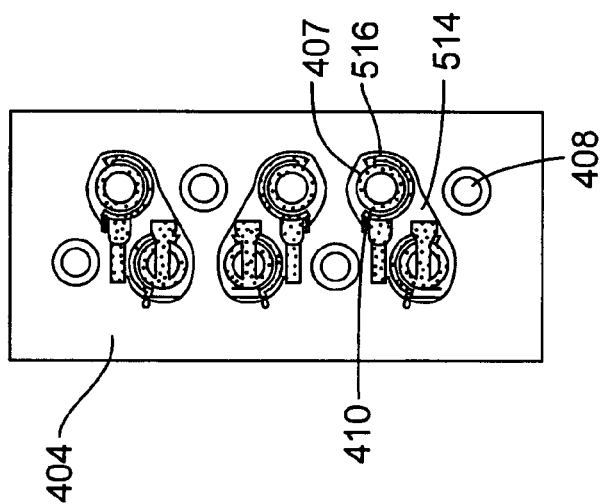
FIG. 5C (Z-X)

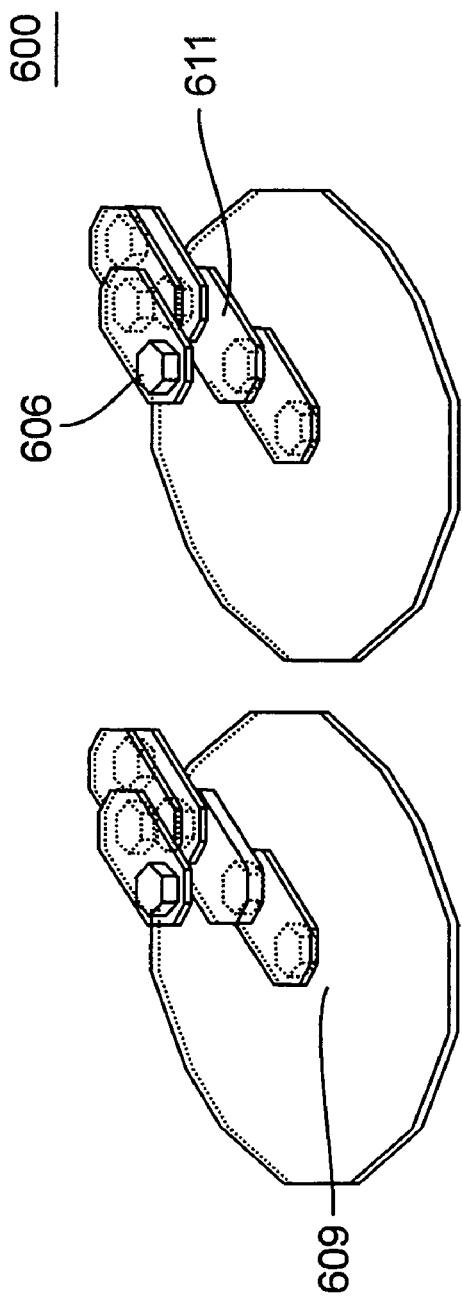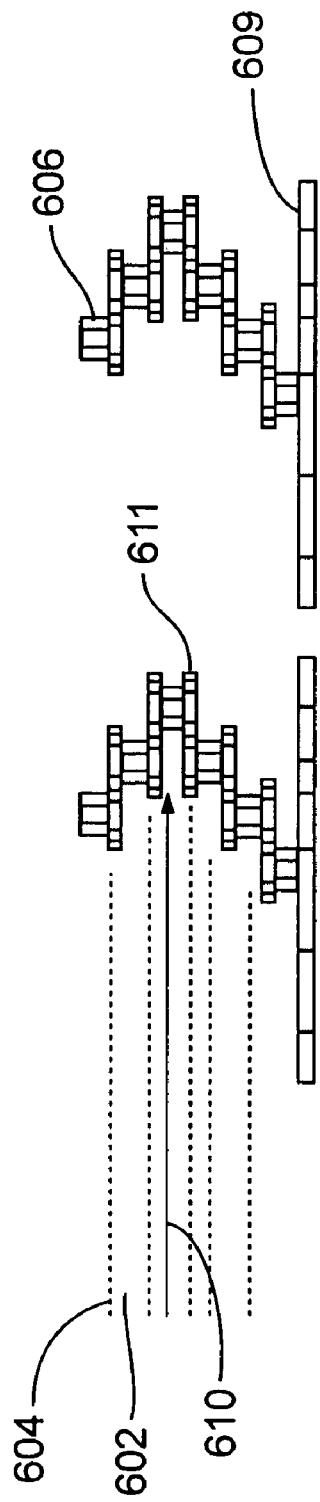
FIG. 6A
FIG. 6B

US 7,474,539 B2

INDUCTOR

TECHNICAL FIELD & BACKGROUND

The present disclosure is related generally to the field of electronics, and more specifically but not exclusively, to compensating for an excess capacitance in a circuit board or package.

It is commonly recognized that multi-gigabit per second platform communication channels may be performance limited due to various effects related to the overall transmission line quality of the channel's physical implementation (i.e., printed circuit board (PCB) and package wiring, connectors, chip sockets, etc.). Notably important are factors such as conductor and dielectric losses, impedance mismatch and stub effects. Methods to handle via stubs and the large capacitance they may create have concentrated on their removal or avoidance, namely, by PCB via back drilling or the use of sequential lamination PCB processes that produce blind or buried vias. Both of these approaches, however, are costly to implement.

BRIEF DESCRIPTION OF THE DRAWINGS

The present invention will be described by way of exemplary embodiments, but not limitations, illustrated in the accompanying drawings in which like references denote similar elements, and in which:

FIGS. 4A-4C illustrate various views of a prior art memory board connector on a circuit board;

FIGS. 5A-5C illustrate various views of a memory board connector on the circuit board of FIGS. 4A-4C according to an embodiment of the invention;

FIGS. 6A and 6B illustrate simplified partial views of a prior art Land Grid Array (LGA) package 600;

DETAILED DESCRIPTION OF ILLUSTRATIVE EMBODIMENTS

Embodiments of the present invention include, but are not limited to, a component having inductor adapted to provide an inductance to at least partially compensate for a capacitance in a circuit of a component, method for making such component, and system for having such component.

Various aspects of the illustrative embodiments will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative embodiments. However, it will be apparent to one skilled in the art that embodiments of the present invention may be practiced without the specific details. In other instances, well-known features are omitted or simplified in order not to obscure the illustrative embodiments.

Various operations will be described as multiple discrete operations, in turn, in a manner that is most helpful in understanding embodiments of the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

For simplicity and clarity of explanation, various embodiments of the invention are shown in the figures according to various views. It is to be appreciated that such views are merely illustrative and are not necessarily drawn to scale or to the exact shape. Furthermore, it is to be appreciated that the actual devices utilizing principles of embodiments of the invention may vary in shape, size, configuration, contour, and the like, other than what is shown in the figures, due to different manufacturing processes, equipment, design tolerances, or other practical considerations that result in variations from one semiconductor device to another.

Figure 1:
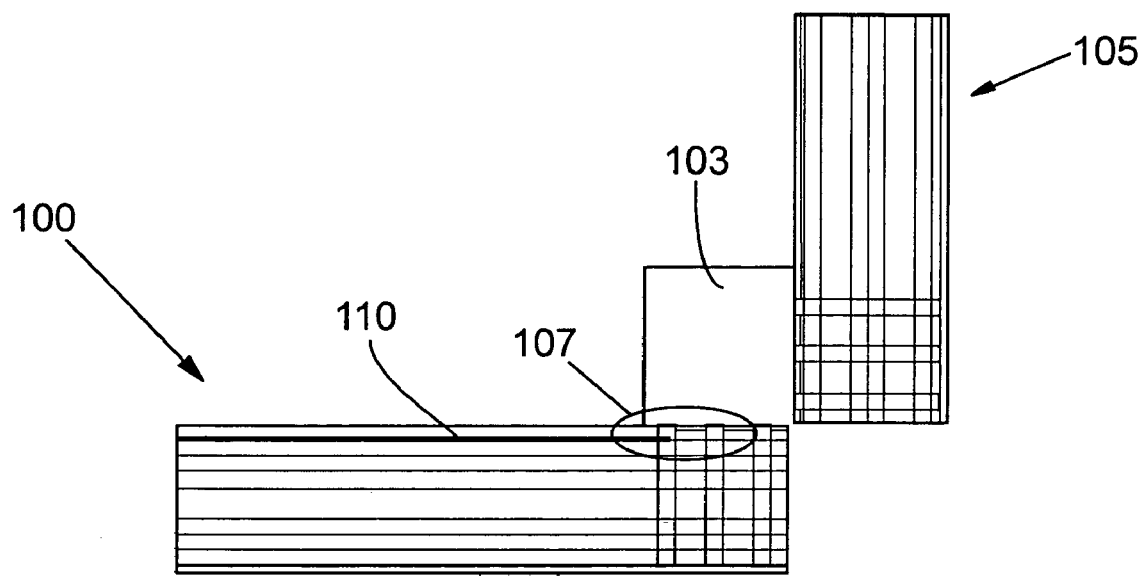
FIG. 1 illustrates a simplified side view of two example prior art connected circuit boards.

FIG. 1 illustrates a simplified side view of two prior art circuit boards connected at a backplane connector. In FIG. 1, a backplane or first circuit board 100 is connected at a backplane connector 103 to a second circuit board 105. Circuit board 100 includes a plurality of dielectric or signal layers disposed within circuit board 100, each of the plurality alternating with each of a plurality of reference or ground planes. Note that at least one transmission line or trace 110 is disposed in one of the pluralities of signal layers. Enlarged views corresponding to an area 107 of FIG. 1 are shown in FIGS. 2A and 2B.

Figure 2A:
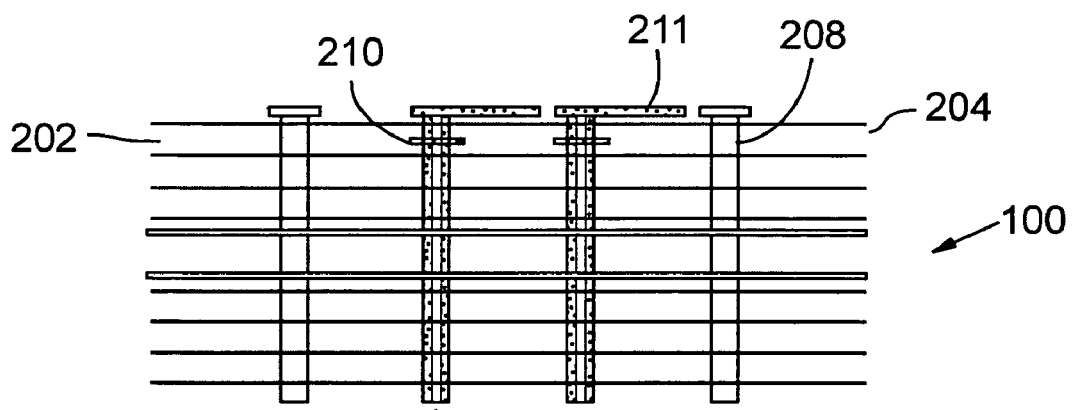
FIGS. 2A and 2B illustrate enlarged partial views at a backplane connector on one of the example prior art circuit boards of FIG. 1.
Figure 2B:
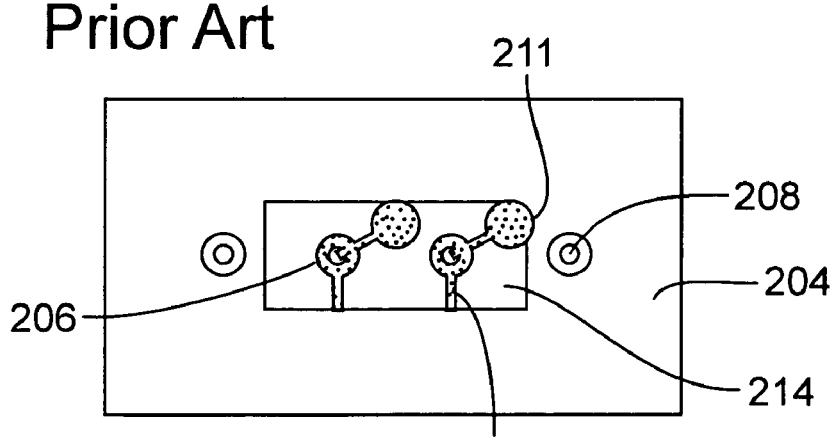

FIG. 2A shows a side view of a portion of circuit board 100 at backplane connector 103 of FIG. 1. As noted above, circuit board 100 includes one or more signal layers 202 alternating with one or more ground planes 204. A pair of signal vias or vias 206 is connected to a pair of traces 210 and intersects signal layers 202 and ground planes 204. At a terminating end of each of via 206 is a via pad 211. One or more ground pins 208 are located adjacent to vias 206. A top-down view of the portion of circuit board 100 is shown in FIG. 2B, where pair of vias 206, via pads 211 and pair of traces 210 are surrounded by a clearance or antipad 214 and ground plane 204.

Figure 3A:
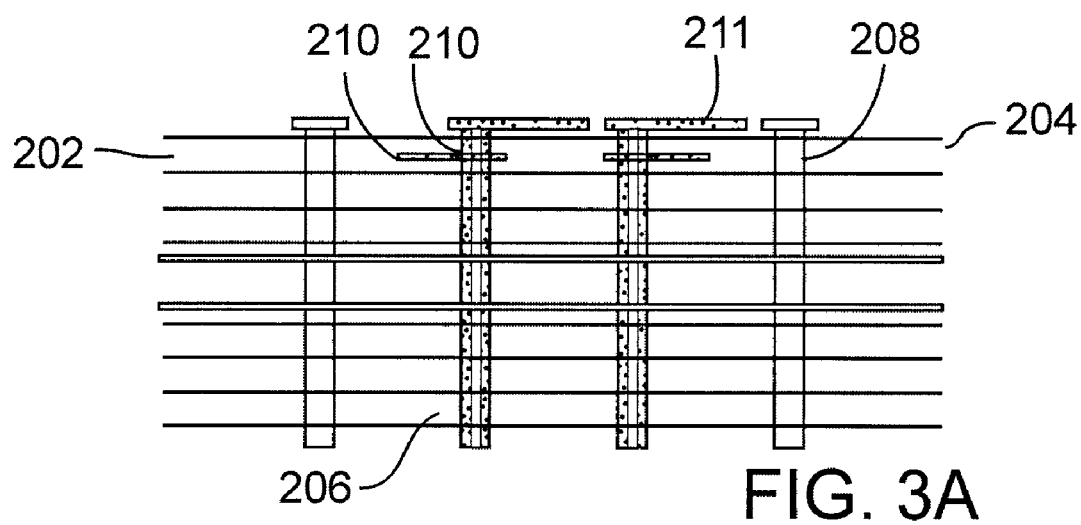
FIGS. 3A and 3B illustrate enlarged partial views of the circuit board of FIGS. 2A and 2B according to one embodiment.
Figure 3B:
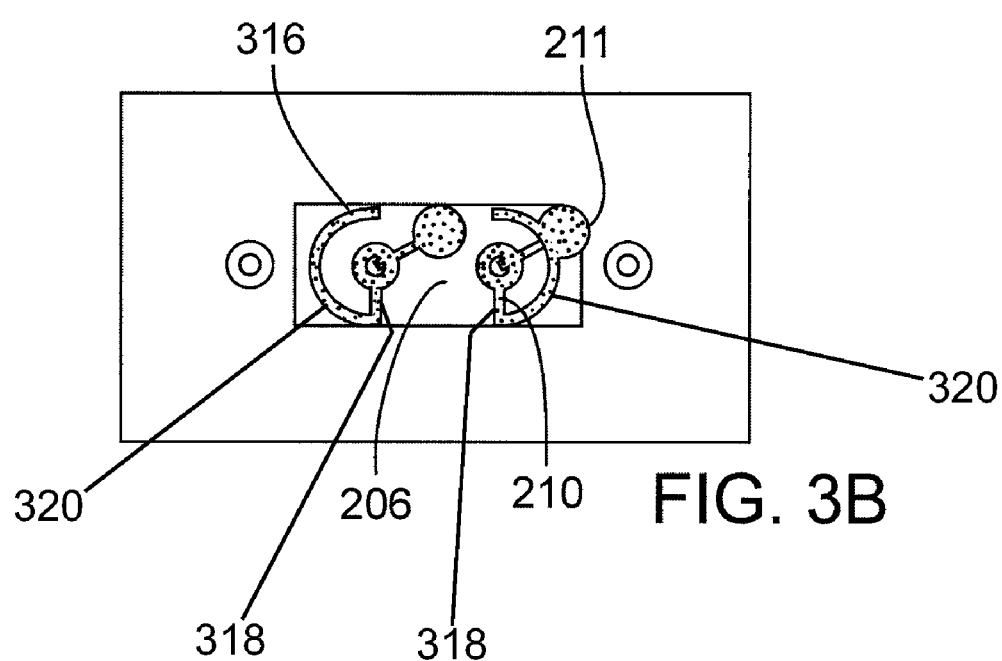

According to an embodiment of the invention, FIGS. 3A and 3B illustrate a circuit board 300 including a pair of inductors 316, each of the pair coupled to each of a pair of respective traces 210 disposed in a signal layer 202. As can be seen in the top-down view of FIG. 3B, inductor 316 forms at least a portion of a coil that lies coplanar in signal layer 202. In an embodiment, inductor 316 may be formed by trace 210 and may be adapted to provide an inductance to at least partially compensate for at least part of a capacitance occurring during transmission of a signal along trace 210. As depicted in FIG. 3B, the inductors 316 may each comprise of a first portion 318 and a second portion 320, the first portions 318 being coupled to a respective via 206, and the second portions 320 having crescent shapes having first ends and second ends, the first ends being coupled to the first portions 318 and the second ends being dead-ends. As further depicted in FIG. 3B, the crescent shaped second portions 320 partially encircles their respective vias 206 and may have half-circle shapes with opposing openings that face each other.

Note that $Z=\sqrt{L/C}$ where Z, L, and C represent impedance, inductance and capacitance, respectively. Accordingly, an increased or excess capacitance, results in a lowered impedance. In order to substantially maintain a targeted impedance, inductor 316 may increase an inductance, to boost the lowered impedance. Accordingly for the embodiment, inductor 316 may compensate for an excess capacitance created at least in part by a via 206.

Thus, for the embodiment, a pair of vias 206 formed in a dielectric or signal layer is provided along with a pair of traces 210 coupled to a respective each of the pair of vias 206. In the embodiment, each of the pair of traces 210 may be coupled to form respective inductive elements or inductors 316 adjacent to each of the vias 206, each of the inductive elements contributing to increasing or boosting a lowered impedance in a circuit at an interconnect included in circuit board 300. In an embodiment, each of the pair of traces 210 is coupled adjacent to a source of excess capacitance and may be tunable according to an amount of capacitance in the interconnect.

In alternate embodiments, inductor 316 may be used at other locations in a circuit board 300 and in various other suitable devices to counteract or compensate for an excess capacitance or impedance discontinuity. To further illustrate, FIGS. 4A-4C show several views of a portion of a prior art memory board connector on a motherboard or circuit board 400. As shown in the X-Y view of FIG. 4A, memory board connector 401 may include pairs of via pins or vias 406 adjacent to one or more ground pins 408. As illustrated, vias 406 and ground pins 408 intersect signal layers 402 and ground planes 404. Vias 406 are arranged to transmit an electronic signal to a memory board by a socket connection in a direction of reference arrow 409.

FIGS. 4B and 4C are Z-Y and Z-X views of connector 401, respectively. As can be seen in FIG. 4C, one or more traces 410 are coupled to each of vias 406 at a respective via pad 407.

Next, FIGS. 5A-5C illustrate a connector 501 on a circuit board 500 according to an embodiment of the invention. As shown, for the embodiment, trace 410 is coupled to via 406 and may form a coil-like structure or inductor 516 to provide an inductance to counteract a capacitance occurring during the transmission of the electronic signal. As shown in the embodiment, inductor 516 may be coupled to via pad 407 of intersecting via 406.

Note that for the embodiment, via 406 intersects dielectric or signal layer 402 at an antipad or opening in signal layer 402 and that coil-like structure or inductor 516 may be disposed substantially in the opening. Further note that one or more ground planes 404 may be disposed on one or more sides of signal layer 402, ground planes 404 having openings vertical to or substantially above or beneath inductor 516. In an embodiment, the openings may help to reduce a capacitance in circuit board 500. Note that in the embodiment, connector 501 may be a connector for a dual-in line memory module (DIMM), single-in line memory module (SIMM) or other suitable memory module or board. Thus, in the embodiment, inductor 516 may be located at an interconnect such as, but not limited to, a socket or connector on circuit board 500.

As a further embodiment, the inductor may be adapted to compensate for an excess capacitance in a package, such as a land grid array (LGA) package. To illustrate, exposed partial views of a bottom of a prior art LGA package 600 are shown in FIGS. 6A and 6B.

FIG. 6A shows a simplified perspective view of package 600. Package 600 includes a land or contact 609 that may be relatively large in relation to a micro-via or via 606 as well as other components of package 600. As such, contact 609 may create an excess capacitance that may interfere with the transmission of a electronic signal in package 600. Referring to an enlarged side view shown in FIG. 6B, disposed within package 600 is a plurality of signal layers, each of the plurality alternating with each of a plurality of ground planes, as indicated at locations 602 and 604, respectively. Each of a plurality of vias 606 is formed in each of a respective signal layer in a staggered arrangement, each via 606 being coupled to one or more via pads 611. In one operation, an electronic signal may travel from a transmission line or trace 610 to via pad 611 and via 606 to arrive at a bottom land or contact 609 to exit package 600.

Figure 7A:
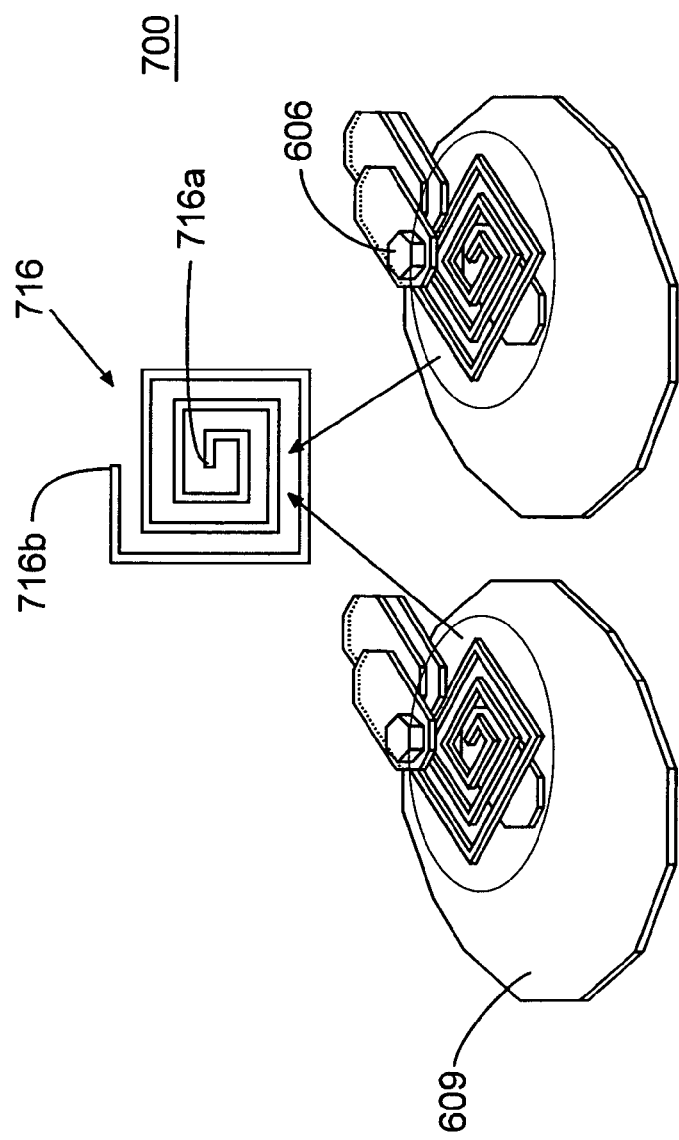
FIGS. 7A and 7B illustrate simplified views of the LGA package of FIGS. 6A and 6B according to an embodiment of the invention.
Figure 7B:
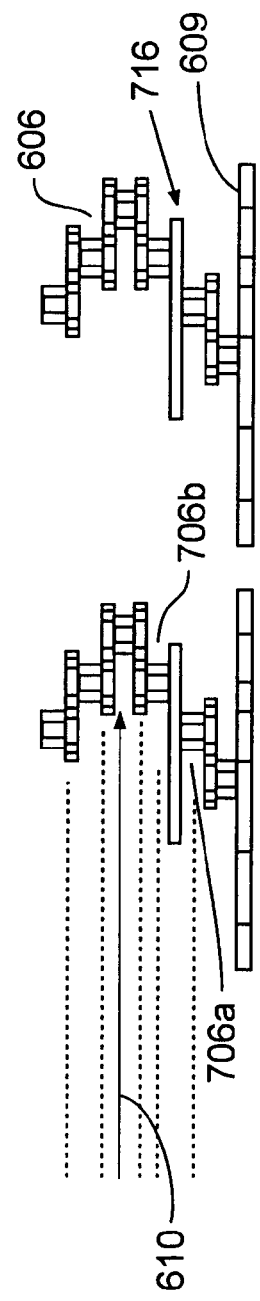

Referring now to FIGS. 7A and 7B wherein a package 700 is shown according to embodiments of the invention. In the perspective view shown in FIG. 7A, for the embodiment, inductor 716 forms a coil or coil-like structure coplanar to signal layers and ground planes of package 700. In the illustrated embodiment, inductor 716 has terminating ends 716a and 716b and is tunable to change an amount of inductance according to a number of concentric turns in the inductor that lies coplanar in the signal layer. Note that in the embodiment shown, inductor 716 may have at least three concentric turns and is formed having windings in a counter-clockwise direction. In alternate embodiments, inductor 716 may have various form factors and may have windings in a clockwise direction as well.

FIG. 7B illustrates that, in an embodiment, terminating ends of inductor 716 may be coupled to respective signal vias. More specifically, in an embodiment, a first terminating end of inductor 716a (see exploded view in FIG. 7A) may be coupled to a first via 706a in a first signal layer, while second terminating end 716b may be coupled to a second signal via 706b, disposed in a next signal layer. Thus, for the embodiment, package 700 may include a dielectric layer and a via intersecting the dielectric layer, the via arranged to transmit an electronic signal. For the embodiment, a trace 610 may be disposed in the dielectric layer and coupled to the intersecting via, the trace further coupled to a coil-like structure or inductor 716 to provide an inductance to counteract a capacitance occurring during transmission of the electronic signal.

It should be noted that while for ease of understanding, only one pair of inductors 716 is shown in FIG. 7, in alternate embodiments, package 700 may include additional inductors 716.

In various embodiments, package 700 may be a package different from an LGA package, such as a ball-grid array (BGA) or pin-grid array (PGA) package.

Figure 8:
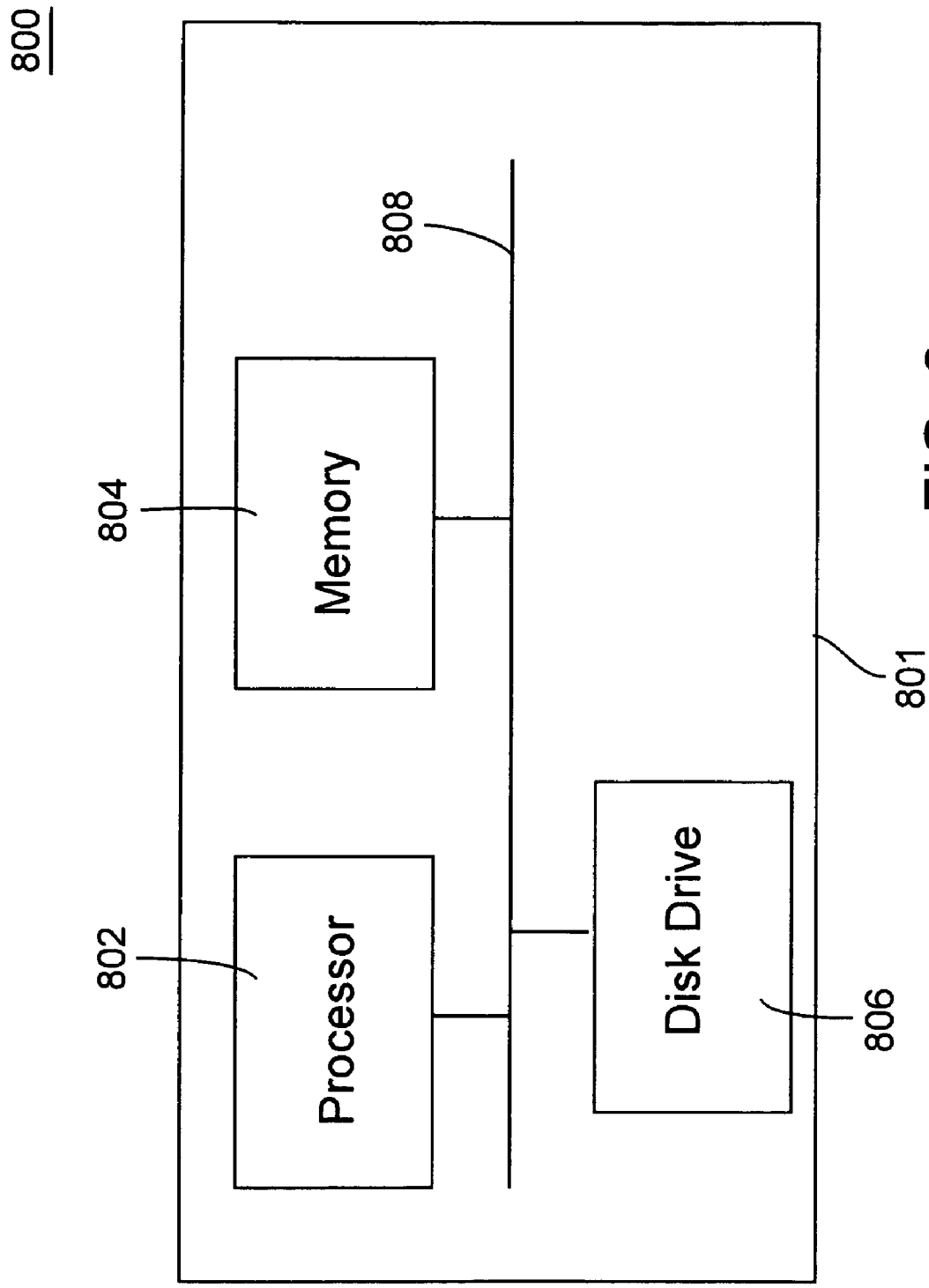
FIG. 8 illustrates a system in accordance with an embodiment.

Finally, FIG. 8 illustrates a system 800 in accordance with one embodiment. As illustrated, for the embodiment, system 800 includes a processor 802, a memory 804, a disk drive 806 and a circuit board 801 including a peripheral control interface (PCI) bus or high speed differential (HSD) serial bus 808 to couple processor 802, memory 804, and disk drive 806 to each other. In the embodiment, circuit board 801 may include a signal or dielectric layer, such as the dielectric layers shown in FIGS. 1-7. Furthermore, for the embodiment, PCI bus 808 may include a plurality of traces disposed in the dielectric layer, at least some of the plurality of traces each forming at least a portion of a coil or a spiral to contribute to achieving an inductance to compensate for a capacitance in circuit board 801. In an embodiment, at least a portion of the spiral may be coupled to a backplane connector or a memory device connector on circuit board 801. In an embodiment, such a memory device connector may comprise a DIMM board connector.

Additionally, while for ease of understanding, processor 802, memory 804 and disk drive 806 are shown as being coupled to a "simple" PCI bus 808, in practice, PCI bus 808 may comprise multiple bus "segments" bridged by e.g. a PCI bus bridge.

In various embodiments, system 800 may be a server, a desktop computer, a laptop computer, a tablet computer, a palm-sized computing device, a set-top box, a digital camera, a media rendering unit, or a CD/DVD player.

Thus, it can be seen from the above descriptions, a novel component having an inductor adapted to boost a lowered impedance by providing an inductance to at least partially compensate for a capacitance in a circuit of the component, method for making such component, and system for having such component have been described. While the present invention has been described in terms of the foregoing embodiments, those skilled in the art will recognize that the invention is not limited to the embodiments described. Embodiments of the present invention can be practiced with modification and alteration within the spirit and scope of the appended claims.

Thus, the description is to be regarded as illustrative instead of restrictive on embodiments of the present invention.

What is claimed is:

1. An apparatus, comprising:
   a selected one of the group consisting of a circuit board and a package;
   a dielectric layer disposed in the selected one;
   a via intersecting the dielectric layer, the via arranged to transmit an electronic signal; and
   a trace disposed in the dielectric layer and coupled to the intersecting via, the trace having a first and a second portion to provide an inductance to counteract a capacitance occurring during a transmission of the electronic signal, wherein the first portion is coupled to the intersecting via and the second portion having a crescent shape, wherein the crescent shape includes a first end and a second end opposite the first end, the first end being coupled to the first portion, and the second end being a dead-end.

2. The apparatus of claim 1 wherein the selected one comprises a circuit board and the first and the second portion are located at an interconnect on the circuit board.

3. The apparatus of claim 2 wherein the interconnect comprises a socket or a connector.

4. The apparatus of claim 1 wherein the second portion comprises a half-circle shape.

5. The apparatus of claim 1 wherein the crescent shaped second portion partially encircles the via.

6. The apparatus of claim 1 wherein the via intersects the dielectric layer at an opening in the dielectric layer, and the trace is disposed substantially in the opening in the dielectric layer.

7. The apparatus of claim 6, further comprising one or more ground planes disposed on one or more sides of the dielectric layer, wherein the one or more ground planes include openings substantially above or beneath the trace.

8. The apparatus of claim 1, further comprising a via pad at the via.

9. The apparatus of claim 1, further comprising:
   another via configured to intersect the dielectric layer, the another via arranged to transmit another electronic signal; and
   another trace disposed in the dielectric layer and coupled to the another intersecting via, the another trace having a first and a second portion to provide another inductance to counteract another capacitance associated with the another electronic signal, the first portion of the another trace coupled to the another via and the second portion of the another trace configured in a crescent shape.

10. The apparatus of claim 9, wherein the second portions of the trace and the second portion of the another trace have opposing openings that face each other.

11. The apparatus of claim 10, wherein the crescent shape of the second portion of the trace and the crescent shape of the second portion of the another trace comprise half-circle shapes.

12. The apparatus of claim 10, wherein the crescent shape of the second portions of the trace and the crescent shape of second portion of the another trace partially encircle the via and the another via, respectively.

* * * * *